TUNNEL DIODE INVERTER

Filed Dec. 29, 1960

INVENTOR.
ABDUL R. HABAYEB

BY

Fred Jacob

ATTORNEY

United States Patent Office 3,131,313

Patented Apr. 28, 1964

3,131,313
TUNNEL DIODE INVERTER

Abdul R. Habayeb, Lawrence, Kans., assignor to Minneapolis-Honeywell Regulator Company, Minneapolis, Minn., a corporation of Delaware Filed Dec. 29, 1960, Ser. No. 79,320
25 Claims. (Cl. 307—88.5)

The present invention relates in general to new and improved circuits for use in digital computers and more particularly to computer logic circuits which are capable of very rapid operation.

Solid-state devices which are known as tunnel diodes have found widespread acceptance in digital computer circuits. Such tunnel diodes are not only capable of carrying out a very rapid switching action, but the negative resistance region of the diode additionally enables a relatively simple tunnel diode circuit to perform logical functions which heretofore required at least one transistor combined with one or more conventional diodes. As a rule, such tunnel diode circuits are superior in performance to the conventional logic circuit it replaces, and are considerably less expensive to build and to maintain.

The negative resistance region of a typical tunnel diode is located between a pair of positive resistance regions and is separated from the latter by a pair of instability points having corresponding diode peak and valley currents respectively. The positive resistance regions of the tunnel diode afford stable diode operation in two distinct voltage regions so as to produce two stable diode states of operation which are referred to as the low-voltage and the high-voltage state respectively. Upon proper actuation, the diode may be switched between its respective stable states.

One of the problems heretofore encountered in presently available tunnel diode circuits is the return of the circuit to its original state upon being switched. If the circuit has appreciable logical gain, it is usually of the type which requires a separate signal to return the circuit to its original state. If the advantages of rapid switching are to be taken advantage of, the additional signal source must be precisely syncronized with the input signal source. Thus, not only the cost of the circuit itself is increased as a result of the added signal source, but the requirement for synchronizing the two signals at high operating speeds usually offsets the saving in cost which is effected by the original substitution of the tunnel diode circuit for a conventional transistor and diode circuit or the like.

The present invention provides a tunnel diode logic circuit which is extremely fast-acting and which, without sacrificing any logical gain, is capable of switching states upon the receipt of an input pulse and of returning to its original statae in response to the termination of the input pulse. As a consequence, the invention is superior in performance and more economical than presently available equivalent logic circuits. In addition, it is flexible in its application and lends itself to the realization of numerous logic functions heretofore obtainable only with far more complex circuitry.

Accordingly, it is the primary object of this invention to provide a logic circuit of superior performance which overcomes the disadvantages of prior art circuits.

It is another object of this invention to provide a logic circuit employing tunnel diodes, which is fast-acting, economical and reliable in operation.

It is a further object of this invention to provide a tunnel diode circuit for performing logical functions which has appreciable logical gain and which is self-resetting upon the termination of the inpust signal.

It is an additional object of this invention to provide a simple and reliable tunnel diode circuit for performing logical functions which is flexible in the manner in which it may be employed.

The various novel features which characterize the invention are pointed out with particularity in the claims annexed to and forming a part of the present specification. The invention itself, its operation, its advantages and specific objects thereof, will be understood with reference to the following detailed description and the accompanying drawings in which:

Figures 1, 2, 3, 4:
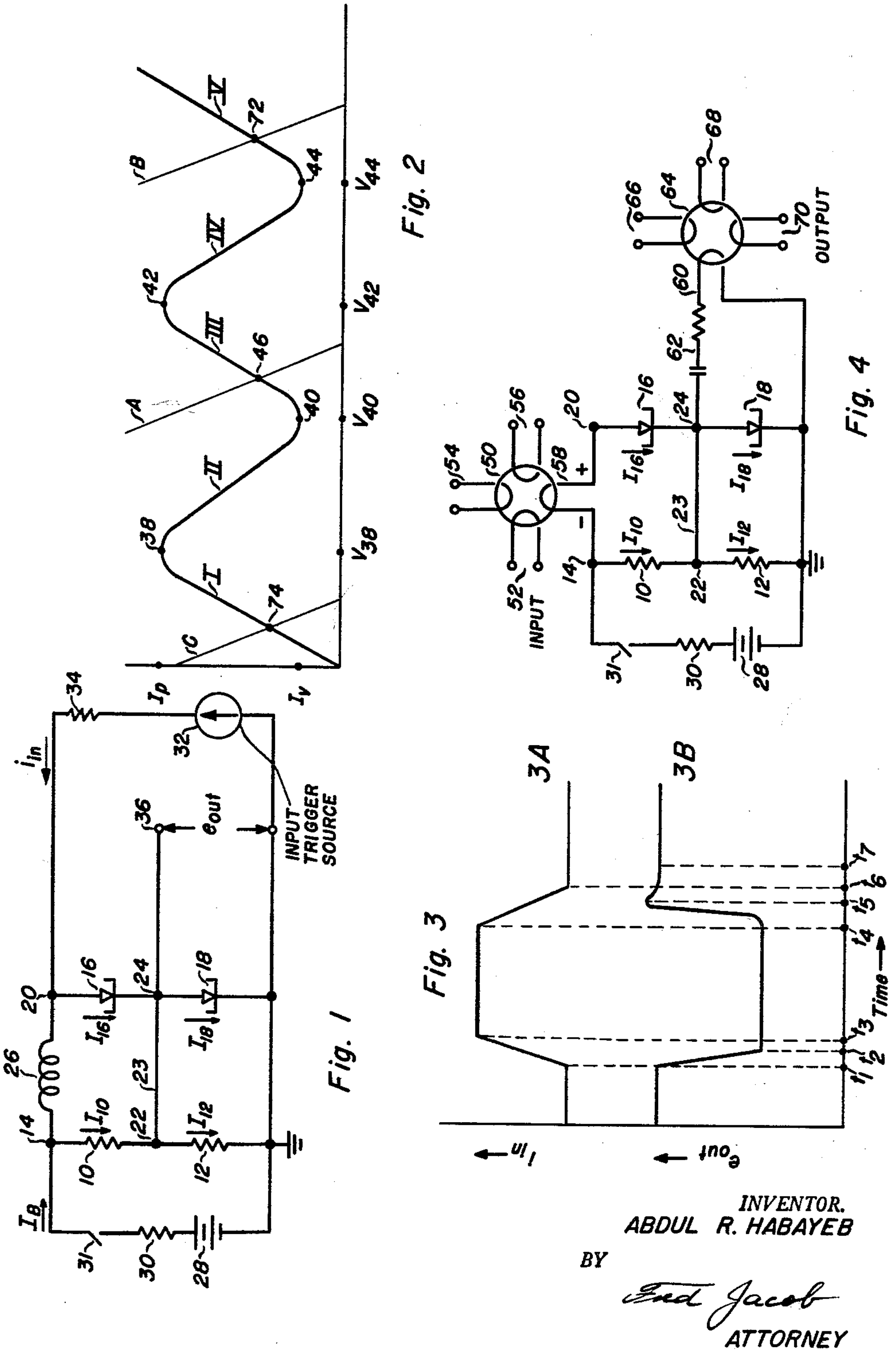
FIGURE 1 illustrates a preferred embodiment of the invention.
FIGURE 2 illustrates the composite diode characteristic of the circuit of FIGURE 1.
FIGURE 3 illustrates the wave forms of the input and output signals of the circuit of FIGURE 1.
FIGURE 4 illustrates another embodiment of the invention.

With reference now to the drawings, FIGURE 1 shows a preferred embodiment of the invention which functions as a logical inverter. A first series combination consisting of a pair of resistors 10 and 12 is connected in between a terminal 14 and ground. A second series combination consisting of a pair of like-poled tunnel diodes 16 and 18 is connected between terminal 20 and ground. A connecting point 22 ties the resistors 10 and 12 together and a connecting point 24 couples the cathode of the diode 16 to the anode of the diode 18. The connecting points 22 and 24 of the respective series combinations are seen to be directly tied together by a coupling link. An inductance 26 is connected between the terminals 14 and 20.

A bias source consisting of a D.C. battery 28 having a relatively low internal resistance 30 is connected in series with a switch 31 across the first series combination between the terminals 14 and ground. A trigger source 32 which has a relatively high resistance 34 so as to approach an ideal current source, is connected across the second series combination between the terminal 20 and ground. An output terminal 36 is connected to the point 24 of the diode combination.

In the embodiment of the invention which is illustrated in FIGURE 1, the resistance 10 is larger than the resistance 12 and preferably $R_{10}=1.2R_{12}$. The diodes are substantially identical, i.e. they have substantially the same peak and valley currents for identical applied voltage swings. The diode forward resistance value in the high-voltage state is approximately equal to that of the resistor 12 and is of the order of one-tenth the value of resistor 12 when in the low-voltage state.

The operation of the circuit will be explained with reference to FIGURES 2 and 3 which illustrate the composite characteristic of the circuit of FIGURE 1 and the input and output signal wave forms respectively. It will be understood that the composite diode characteristic of the circuit is made up of the respective current-voltage characteristics of the individual diodes. The composite characteristic is seen to include three positive resistance regions I, III and V interlaced with two negative resistance regions II and IV. Stable diode operation is possible only in a positive resistance region. The negative resistance region II is separated from the positive resistance regions I and III by a peak instability point 38 and a valley instability point 40 respectively. These instability points have corresponding current values $I_P$ and $I_V$ and corresponding voltage values $V_{38}$ and $V_{40}$ respectively. Similarly, the negative resistance region IV is separated from the positive resistance regions III and V by a peak instability point 42 and a valley instability point 44 having corresponding voltage values $V_{42}$ and $V_{44}$. Since the diodes 16 and 18 are substantially identical, the peak and valley currents which correspond to the instability points 42 and 44 are substantially the same as those for the instability points 38 and 40.

When the switch 31 is closed, a bias voltage is applied which causes current $I_b$ to flow as indicated in FIGURE 1. The bias voltage is chosen so that the steady state voltage which appears across the diode combination is sufficient to sustain only one of the tunnel diodes in the high-voltage state while the other tunnel diode is in its low-voltage state. Upon closing of the switch 31, the inductance 26 at first prevents any current from flowing through the tunnel diode 16. Accordingly, all of the current $I_b$ at first passes through the resistor 10 where it is labeled $I_{10}$. At the connecting point 22, the current splits into the currents $I_{12}$ and $I_{18}$. Since the forward resistance of the tunnel diode 18, prior to the application of the voltage across it, is low relative to the value of the resistor 12, the major current flow from the connecting point 22 is by way of the link 23 to the connecting point 24 and through the diode 18. The amplitude of the current $I_{18}$, which is therefore large with respect to $I_{12}$, is sufficient to exceed the peak threshold $I_p$ of the tunnel diode 18. As a result, the diode 18 switches substantially instantaneously to its high-voltage state. The steady state diode current for this condition is slightly above the valley threshold $I_V$.

As previously explained, the applied bias voltage is sufficient to support only one of the tunnel diodes 16 and 18 in its high-voltage state, but not both. It follows that, in the absence of any other signals, the diode 16 will reach the low-voltage state only. The relatively small inductance 26, which initially blocks any current flow, subsequently acts in the manner of a valve to permit an increasing amount of the current $I_b$ to flow to the terminal 20 at the expense of current $I_{10}$. Since the value of the resistor 34 is relatively high, substantially all of this current flows through the tunnel diode 16 to the connecting point 24. Ultimately, since the forward resistance of the diode 16 is its low-voltage state is relatively small compared to the value of the resistor 10, the current $I_{16}$ which flows through the diode 16 at steady state conditions is much greater than $I_{10}$ and reaches a value slightly below $I_P$.

Since the forward resistance of the diode 18 in its high-voltage state is approximately the same as the value of the resistor 12, the current through the two arms of the parallel combination consisting of the resistor 12 and of the diode 18 will split substantially equally. $I_{10}$ being small in comparison to $I_{16}$, the current which flows in each arm of the aforementioned parallel combination has an amplitude of approximately one-half of $I_{16}$. Both of the currents $I_{12}$ and $I_{18}$ are, of course, large compared to $I_{10}$. As a result, even though the value of the resistor 10 is approximately 20% greater than the value of the resistor 12, a larger voltage drop exists across the resistor 12 than across the resistor 10. These voltages, which are applied across the diodes 18 and 16 respectively, maintain the latter in the high- and low-voltage states respectively under steady state conditions following the application of the bias voltage. It will also be clear that the current flowing in the diode 16 under these conditions is approximately twice the current flowing in the diode 18.

The operating condition where the diode 16 is in the low-voltage state and the diode 18 is in the high-voltage state is equivalent to circuit operation in the positive resistance region III of the composite diode characteristic. This is indicated in FIGURE 2 by the intersecting point 46 of the diode characteristic and the load line A. The circuit parameters are chosen for monostable diode operation, i.e. the slope of the load line is such that it intersects the composite charatceristic at a single point.

It will be clear that the circuit will continue to operate in the positive resistance region III of the composite characteristic if the respective voltage states of the diodes are reversed so that the diode 16 is in the high-voltage state and the diode 18 is in the low-voltage state. The circuit may be switched to the latter operating condition by applying a current input pulse $i_{in}$ of predetermined duration to the point 20, which is large enough to drive the current $I_{16}$ beyond $I_P$, but not so large as to support the operation of both diodes in the high-voltage state. Since the steady state value of $I_{16}$, upon the application of a bias voltage, is only slightly below $I_P$, the pulse required from the trigger source 32 to carry out this operation is small.

When the current $I_{16}$ exceeds the threshold level $I_P$, the diode 16 switches to the high-voltage state. The inductance 26 which opposes any instantaneous change of the current flowing through it, is sufficiently small to permit the current $I_{16}$ to decrease to a level slightly above $I_V$ as soon as the diode 16 has switched. As a consequence, a much larger proportion of the bias current $I_B$ will be channeled through the resistor 10, i.e. the current $I_{10}$ will increase at the expense of $I_{16}$.

For a brief time interval, as the diode 16 passes through the negative resistance region during the switching operation, it acts to oppose the trigger current $i_{in}$ which attempts to force more current through the resistor 10 at the expense of $I_{16}$. The interaction is such that the current $I_{18}$ decreases below the valley threshold $I_V$ to switch the diode 18 to the low-voltage state. This circuit condition, as previously pointed out, is required by the value of the applied bias voltage. Accordingly, the switching of the diode 18 occurs substantially at the same time as the switching of the diode 16, the time difference being of the order of 2–5 nanoseconds.

After the diode 18 has switched to the low-voltage state, the current $I_{18}$ increases at the expense of the current $I_{12}$ until the steady state condition which prevails for the duration of the trigger pulse is attained. The diode $I_{18}$ is now in the low-voltage state, while the diode 16 is in the high-voltage state. $I_{10}$ is now approximately equal to $I_{16}$, both of these currents being approximately equal to one-half the value of $I_{18}$. $I_{12}$ is, of course, small with respect to $I_{18}$. When the steady state pulse condition is reached $i_{in}$, which is much smaller than $I_B$, in essence opposes the latter since the steady state impedance value of the inductance 26 is very small. In effect, then, $i_{in}$ serves to lower slightly the bias voltage which is applied across the first series combination. The over-all effect of this action on the circuit is negligible.

The above-mentioned steady state pulse condition, in which the diode 16 is in the high-voltage state and the diode 18 is in the low-voltage state, endures until the termination of the applied input pulse. As the input current pulse subsides, the opposing bias current which flows through the diode has a tendency to increase. This increase is opposed by the inductance 26 which opposes any instantaneous energy transfer. As a consequence, the current $I_{16}$, part of which was due to the input current $i_{in}$, decreases until it reaches the threshold level $I_V$ and the diode 16 switches to the low-voltage state. The blocking action of the inductance 26 causes the increased bias current to flow through resistor 10 and to increase the value $I_{10}$. As long as the diode 18 is in the low-voltage state and its forward resistance is low compared to the value of the resistor 12, the major portion of the increased current flow in the resistor 10 will increase $I_{18}$. The latter current rises until the peak level $I_P$ is exceeded and the diode 18 switches.

Although the switching of the diodes back to their respective original voltages states occurs substantially at the same time, such switching is not always initiated by the same diode. Regardless of which diode actually switches first, the circuit reaches the original steady state operating condition when the diodes exchange state. At such time, the diodes again operate in accordance with the applied bias voltage for monostable diode operations at the operating point 46 on the composite characteristic.

The circuit action is seen to be dependent on the presence of the inductance 26 which is connected between the terminals 14 and 20. The function of the inductance is to provide a current blocking action at the proper instance and to valve the current flow in ever-increasing amounts thereafter. By virtue of the energy storage which takes place in the inductance, the current flow through the diodes is increased and the logical gain of the circuit is raised. A relatively high gain is thus obtained without sacrificing the self-resetting properties of the circuit.

With the illustrated polarity of the tunnel diodes 16 and 18, the applied input pulses must be positive. The reversal of the diode 18 from the high- to the low-voltage state, in response to the input pulse, produces a negative output pulse between the terminal 36 and ground which is maintained for the duration of the input pulse. Accordingly, the circuit acts as a logical inverter.

This operation will become clear from FIGURE 3 where the wave forms of the input signal $i_{in}$ and the output signal $e_{out}$, which appears between the output terminal 36 and ground, are illustrated. Although ideally a square input pulse is applied, in practice it is difficult to attain this goal. The input pulse shown in FIGURE 3A has an approximate rise time which extends from the points $t_1$–$t_3$ on the time axis. The fall time of the input current pulse extends from $t_4$–$t_6$. As will be seen from FIGURE 3B, the responsive negative output pulse, which is less than the corresponding rise time of the input pulse, has a rise time which extends from $t_1$–$t_2$. The latter is directly attributable to the rapid switching action of the tunnel diodes. The current $I_{16}$ exceeds the peak threshold level of the diode 16 prior to the time $t_3$ when the input pulse has reached its maximum level. Since the tunneling effect in the diodes theoretically occurs at the speed of light (actually it takes between 2–5 nanoseconds), both tunnel diodes complete the switching before time $t_3$. As a result, the output pulse reaches its maximum level at time $t_2$ before the leading edge of the input pulse has actually completed its rise.

The negative voltage level of the output pulse is maintained until the time $t_4$ which initiates the trailing edge of the input pulse that extends to $t_6$. The decline of the input pulse triggers the switching action of the tunnel diode in the manner explained above. Even prior to the time $t_6$ when the input pulse reaches zero, the reset switching action of the tunnel diodes 16 and 18 occurs. The output voltage rises and is seen to cross the initial steady state voltage level. A slight positive rise occurs which reaches its peak at the time $t_5$. The initial steady state voltage level is restored at the time $t_7$.

In the embodiment of the invention which is illustrated in FIGURE 1, the trigger source 32 is illustrative only and may well constitute the output of a circuit similar to that shown. It is important for the proper operation of the circuit, however, that the trigger source approach a current source with a high internal resistance. The amplitude of the applied input current pulses must be such as to be sufficient to trigger the diode 16 only and may never be so high as to drive the diode operation to the positive resistance region V of the composite diode characteristic.

At the present state of the art the theory of tunnel diode operation has not been fully explored. Accordingly, the circuit operation which is described above may well be modified in the light of subsequent discoveries. The embodiment of the invention which is illustrated in FIGURE 1 has been successfully operated with the circuit parameters set forth in the table below, wherein the respective circuit components are denoted by appropriate subscripts which correspond to the reference numerals of FIGURE 1:

| $L_{26}$ µh | $R_{10}$ ohms | $R_{12}$ ohms | $R_{16}$ or $R_{18}$ high voltage state ohms | $R_{16}$ or $R_{18}$ low voltage state ohms | $R_{34}$ ohms | $E_{28}$ volts | $i_{in}$ ma. | $e_{out}$ volts |
|---|---|---|---|---|---|---|---|---|
| 10 | 600 | 500 | 500 | 50 | 2,400 | 0.42 | 0.2 | .36 |

The following table shows the approximate applicable pulse time intervals in nanoseconds which were obtained with the circuit above:

| | Duration | Rise Time | Fall Time |
|---|---|---|---|
| $i_{in}$ | 50 | 15 | 20 |
| $e_{out}$ | ---------- | 10 | ---------- |

The embodiment of the invention which is illustrated in FIGURE 4 represents an extension of the principles of the circuit of FIGURE 1 to a core logic circuit. Applicable reference numerals have been retained wherever possible. The circuit includes a magnetic core 50 having an input winding 52, a suppressor winding 54, a drive winding 56 and a sense winding 58. The sense winding is connected between the terminals 14 and 20. The output signal which is derived across the tunnel diode 18, is applied to an input winding 60 that is A.C.-coupled to the connecting point 24 of the diode combination by means of a resistor-condenser combination 62. The input winding 60 is disposed on a core 64 which is further linked by a suppressor winding 66, a drive winding 68 and a sense winding 70. The remaining elements of the circuit of FIGURE 4 are substantially identical to those of FIGURE 1.

In order to understand the operation of the circuit of FIGURE 4, it will be helpful to consider the sense winding 58, which has a relatively low impedance, as a voltage source. The voltage pulses which appear across the terminals at the sense winding are applied in series with the bias voltage that is applied to the diode combination. In this type of diode operation, the inductance of the sense winding 58 determines the voltage states of the respective diodes for steady state conditions. The polarity of the sense winding determines whether or not the voltage pulse which is applied to the circuit aids or bucks the applied bias potential.

For the sake of the present discussion let it be assumed that the circuit is biased in the same manner as the circuit of FIGURE 1 so that one but not both diodes resides in the high-voltage state. Accordingly, the circuit operates in the positive resistance region III of the composite diode characteristic of FIGURE 2 which is applicable here. When the switch 31 is closed, the applied bias current is at first blocked by the inductance of the sense winding 58 and passes through the resistor 10 only. At the connecting point 22 the current $I_{10}$ splits into the two components $I_{12}$ and $I_{18}$, the major portion passing through the tunnel diode 18 due to the low forward resistance of the latter compased to the resistor 12. As in the case of FIGURE 1, the diode 18 switches to the high-voltage state, and the diode 16 assumes the low-voltage state.

If the core 50 has been set by the previous application of the proper signals to the input winding 52 and to the suppressor winding 54, the application of a reset pulse to the drive winding 56 produces an output pulse across the terminals of the sense winding 58. If the circuit is biased to operate at point 46 in the positive resistance region III of the composite diode characteristic shown in FIGURE 2, the amplitude and the polarity of the applied voltage pulse determines the subsequent operation of the circuit.

For a pulse which is positive, i.e. poled as shown in FIGURE 1 so as to aid the bias voltage, and which is sufficient only to switch the tunnel diode 16 to its high-voltage state, the action is the same as that explained in connection with FIGURE 1. Specifically, the two tunnel diodes exchange states and an output signal of the opposite polarity is obtained. The diodes remain in the reversed condition until they are restored to their original states in response to the termination of the applied input pulse. During the foregoing operation, the circuit operation remains at the operating point 46.

It will be clear from a consideration of the circuit of FIGURE 4 that, although the voltage pulse is applied in series with the bias source, it does not affect all elements of the circuit in the same manner as the initial application of voltage by the D.C. source 28. It requires a positive voltage pulse in excess of a predetermined amplitude to switch the tunnel diode 16 to the high-voltage state without causing the diode 18 to switch to the low-voltage state. If such a pulse is applied, the circuit operation shifts to the operating point 72 in FIGURE 2 which represents the intersection of the load line B and the composite diode characteristic in the positive resistance region V. Since the output signal is derived across the tunnel diode 18 which remains in the high-voltage state, no change of the output signal occurs. Similarly, no change of the output signal occurs upon the termination of this pulse when the diode 16 reverts to its low-voltage state.

If a negative voltage pulse in excess of a predetermined amplitude is applied and the circuit is biased as before, the pulse causes the diode 18 to shift states so that both diodes are in the low-voltage state. The circuit operation accordingly shifts to the operating point 74 in the positive resistance region I, which represents the intersection of the load line C and the composite diode characteristic. A negative output pulse is obtained which is maintained until the termination of the negative input pulse when the diode 18 reverts to its high-voltage state. Accordingly, the circuit operates as a logical amplifier wherein the application of a negative input pulse results in a negative output pulse.

It will be clear that the poling of the respective core windings plays an important part in the operation of the circuit. In the foregoing discussion it was assumed that the sense winding and the input winding are poled alike so that the signals which appear across these windings have the same polarity. The winding polarities may, however, be reversed if the inverse logical functions from those discussed above are desired. Moreover, the core may have more than one input winding so as to permit more complex logic functions to be performed. Alternatively, a number of inputs may feed into a single core input winding.

The function of the suppressor windings 54 and 66 on the cores 50 and 64 respectively is conventional in the sense that these windings, when energized, inhibit core switching. Similarly, the drive windings 56 and 68 respectively are used conventionally to reset the cores for readout purposes. The sense winding 70 provides an output signal during the readout of the core 64 which may, if desired, be used to energize a circuit identical to that shown.

The operation of the circuit of FIGURE 4 has been discussed for a pair of identical diodes. If the diodes 16 and 18 have different peak and valley thresholds for substantially identical voltage swings, the steady state bias condition of the diodes need not be restricted to the positive resistance region III. Thus, the diodes may be biased for monostable steady state operation in the region I. Depending on their amplitude, the application of positive input pulses will shift the circuit operations to the respective positive resistance regions III and V, by switching the diode 18 only, or by switching both diodes to the high-voltage state respectively. The diodes remain in their new states for the pulse duration and reset themselves in response to the pulse termination. Positive output pulses of the same amplitude are obtained regardless of whether one or both diodes are switched and the circuit operates as a logical amplifier. Similarly, if the circuit is biased for monostable operation in the positive resistance region V, the application of negative input pulses of different amplitudes will shift the circuit operation to the regions III and I respectively and will maintain it there for the pulse duration. Negative output pulses of the same amplitude are obtained in both instances, again providing amplifier operation of the circuit.

With the above-described circuit it is also possible to obtain output signals which have three voltage levels in response to an input signal having a like number of voltage signal levels. This may be carried out by deriving an output signal between the terminal 20 and ground. Such circuits and the operating principles which are applicable to multistable circuit operation are discussed in detail in the copending applications of the applicant, filed December 29, 1960, bearing Serial Numbers 79,319 and 79,324 and assigned to the assignee of this application.

The speed of response of the circuit of FIGURE 4 is comparable to the values given above in connection with the embodiment of FIGURE 1. As a result of this rapid response, very little delay is experienced between the appearance of the pulse on the output terminals on the sense winding 58 and the application of a corresponding pulse to the input winding 60 of the core 64. If the proper signal on the suppressor winding 66 appears simultaneously with the pulse applied to the input winding 60, the core 64 is set.

The embodiments of the present invention which are shown in FIGURES 1 and 4 are illustrative only without intending to limit the invention. The basic circuit may be modified in various ways without departing from the invention herein. For example, the D.C. bias source may take a different form from the battery and switch arrangement shown, provided only its internal resistance is low. Similarly, the input pulses need not be applied in the precise manner illustrated in the drawing. The latitude given to the nature of the pulse source is again contingent upon the proper internal source resistance. The connecting points 22 and 24 need not be directly connected together, but may be resistively coupled or even coupled by means an inductance in order to effect minor modifications of the circuit performance without altering its basic operation.

The rapid response of the basic circuit of the invention and its various modifications enable it to be used in connection with computers having extremely high speeds of operation. Moreover, the rapid switching speeds bring about a considerable improvement in the signal-to-noise ratio which materially improves the reliability of circuit operation. As previously explained, the ability of the circuit to reset itself in response to the termination of the input pulse, without any sacrifice in the logical circuit gain, makes unnecessary to provision of a separate reset signal source which must be synchronized with the input signal at very high speeds of operation. Thus, the saving which derives from the substitution of the invention for a conventional equivalent logic circuit requiring a greater number of active elements, is not destroyed by the requirement for additional circuitry.

It will be apparent from the foregoing discussion that numerous modifications, changes and equivalents will now occur to those skilled in the art, all of which fall within the true spirit and scope contemplated by the invention.

What is claimed is:

1. An electrical circuit comprising, a pair of resistive impedances connected in a first series combination, a pair of like-poled tunnel diodes connected in a second series combination, the connecting points of respective ones of said series combinations being coupled together, one terminal of each of said series combinations being coupled to a reference point, an inductance coupled between the other terminals of said series combinations, each of said tunnel diodes having a characteristic including a negative resistance range located between first and second positive resistance regions and separated therefrom by a pair of instability points, said positive resistance regions being adapted to sustain corresponding first and second stable states of diode operation, said circuit having a composite characteristic consisting of said individual diode characteristics, means for applying a bias voltage to said other terminal of said first combination to provide monostable diode operation in a chosen positive resistance region of said composite characteristic, means for applying trigger pulses to said other terminal of said second series combination, said trigger pulses being adapted to cause at least one of said diodes to switch stable operating states, said diode being adapted to return to its original operating state in response to the termination of said pulse.

2. An electrical circuit comprising first and second resistive impedances connected in a first series combination between a first terminal and a reference point, first and second substantially identical tunnel diodes connected with the same polarity in a second series combination, the anode of said first diode being connected to a second terminal and the cathode of said second diode being connected to said reference point, the connecting point of respective series combinations being coupled together, each of said diodes having a characteristic including a negative resistance range located between first and second positive resistance regions, said positive resistance regions being adapted to sustain stable low-voltage states of diod eoperation respectively, an inductance connected between said first and second terminals, means for applying a bias voltage to said first terminal adapted to bias said first and second diodes for monostable operation in said low- and high-voltage states respectively, and means for applying trigger pulses to said second terminal, each of said trigger pulses being adapted to switch the state of at least one of said diodes for the pulse duration, said one diode being adapted to return to its original state in response to the termination of said pulse, and means for deriving an output signal from said connecting point of said second series combination.

3. An electrical circuit comprising, first and second resistive impedances connected in a first series combination, first and second like-poled tunnel diodes connected in a second series combination, the connecting points of respective ones of said series combinations being coupled together, an inductance connected between the free terminals of said first resistive impedance and of said first diode respectively, the free terminals of said second resistive impedance and of said second diode respectively being coupled to a reference point, each of said tunnel diodes having a characteristic including a negative resistance range located between first and second positive resistance regions and separated therefrom by a pair of instability points, said positive resistance regions being adapted to sustain corresponding first and second stable states of diode operation, said circuit having a composite characteristic consisting of said individual diode charactertistics, means for applying a bias voltage to said free terminal of said first resistive impedance adapted to provide monostable operation of said first and second diodes in their first and second stable operating states respectively, means for applying trigger pulses to said other terminal of said second series combination, said trigger pulses being adapted to cause at least one of said diodes to switch stable operating states, said one diode being adapted to return to its original operating state in response to the termination of said pulse.

4. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, an inductance connected between said first and second terminals, means for applying a bias voltage to said first terminal adapted to operate each of said diodes in a predetermined one of said voltage states, and means for applying trigger pulses to said second terminal adapted to reverse the voltage state of at least one of said diodes for the pulse duration, said last-recited diode being adapted to return to its original voltage state in response to the pulse termination.

5. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, an inductance connected between said first and second terminals, means for applying a bias voltage to said first terminal adapted to operate each of said diodes in the monostable mode in a predetermined one of said voltage states, and means for applying trigger pulses to said second terminal adapted to reverse the voltage state of at least one of said diodes.

6. An electrical circuit for carrying out logical operations comprising, first and second resistive impedances connected in a first series combination, first and second like-poled tunnel diodes connected in a second series combination, each of said tunnel diodes having a characteristic including a negative resistance region intermediate a pair of instability points, the connecting points of said first and second series combinations being coupled together, an inductive impedance connected between the free terminals of said first resistive impedance and of said first tunnel diode respectively, the free terminals of said second resistive impedance and of said second diode respectively being coupled to a common reference point, means for applying a bias voltage across said first series combination, and means for applying trigger pulses to said free terminal of said first tunnel diode.

7. An electrical circuit for carrying out logical operations comprising, first and second resistive impedances connected in a first series combination, first and second identical like-poled tunnel diodes connected in a second series combination, each of said tunnel diodes having a characteristic including a negative resistance region intermediate a pair of instability points, the connecting points of said first and second series combinations being coupled together, an inductive impedance connected between the free terminals of said first resistive impedance and of said first tunnel diode respectively, the free terminals of said second resistive impedance and of said second diode respectively being coupled to a common reference point, means for applying a bias voltage across said first series combination, means for applying trigger pulses to said free terminal of said first tunnel diode, and means for deriving an output signal from the connecting point of said second series combination.

8. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, an inductance connected between said first and second terminals, means for biasing each of said diodes for operation in a predetermined one of said voltage states, and means for applying trigger pulses adapted to reverse the voltage state of at least one of said diodes.

9. An electrical circuit comprising an inductive impedance having first and second terminals, a common junction point, a first resistive impedance and a first tunnel diode connected between said junction point and said first and second terminals respectively, said first tunnel diode being poled to conduct current to said junction point, a second resistive impedance and a second tunnel diode connected between said junction point and a reference point, said second tunnel diode being poled to conduct current to said reference point, said first and second tunnel diodes each having a characteristic including a negative resistance region intermediate a pair of instability points, means for applying a bias voltage between said first terminal and said reference point, and means including a relatively high internal resistance for applying trigger pulses to said second terminal.

10. An electrical circuit comprising a pair of resistive impedances connected in a first series combination, a pair of like-poled tunnel diodes connected in a second series combination, the connecting points of said first and second series combinations being coupled together, each of said tunnel diodes having a current-voltage characteristic including a negative resistance range located between a pair of positive resistance regions and separated from the latter by a pair of instability points, said positive resistance regions being adapted to support stable diode operation in the low- and high-voltage states respectively, one terminal of each of said series combinations being coupled to a reference point, an inductance connected between the other terminals of said series combinations, means for applying a bias voltage across said first series combination having an amplitude sufficient to operate only one of said diodes in said high-voltage state, and means for applying trigger pulses to said other terminal of said second series combination adapted to reverse the respective voltage states of said diodes.

11. An electrical circuit comprising first and second resistive impedances connected in a first series combination between a first terminal and a reference point, first and second like-poled tunnel diodes connected in a second series combination between a second terminal and said reference point, the connecting points of respective ones of said series combinations being coupled together, each of said diodes having a characteristic including a negative resistance range located between first and second positive resistance regions, said positive resistance regions being adapted to sustain stable high- and low-voltage states of diode operation respectively, an inductance connected between said first and second terminals, means for applying a bias voltage to said first terminal adapted to operate said first diode in said low-voltage state and said second diode in said high-voltage state, and means for applying trigger pulses to said second terminal.

12. The apparatus of claim 11 wherein said first resistive impedance is larger than said second resistive impedance.

13. An electrical circuit comprising first and second resistive impedances connected in a first series combination between a first terminal and a reference point, first and second like-poled tunnel diodes connected in a second series combination between a second terminal and said reference point, the connecting points of respective ones of said series combinations being coupled together, each of said diodes having a characteristic including a negative resistance range located between first and second positive resistance regions, said positive resistance regions being adapted to sustain stable high and low states of diode operation respectively, an inductance connected between said first and second terminals, means for applying a bias voltage to said first terminal adapted to operate said first diode in said low-voltage state and said second diode in said high-voltage state, means for applying trigger pulses to said second terminal adapted to reverse the respective stable states of operation of said diodes for the pulse duration, and means for deriving an output signal from said connecting point of said second series combination.

14. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, an inductance connected between said first and second terminals, means for applying a bias voltage to said first terminal adapted to bias said first and second diodes for monostable operation in said low- and high-voltage states respectively, means for applying trigger pulses to said second terminal adapted to reverse the respective stable states of operation of said diodes for the pulse duration, said diodes being adapted to return to their respective original operating states in response to the termination of said pulse, and means for deriving an output signal from said connecting point of said second series combination.

15. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, an inductance connected between said first and second terminals, means for applying a bias voltage to said first terminal, said bias voltage having a predetermined polarity and being adapted to operate said first and second diodes monostably in the low- and high-voltage states respectively, means for applying trigger pulses to said second terminal having a polarity opposite to said predetermined polarity, each of said trigger pulses being adapted to switch said second diode to its low-voltage state and to maintain it there for the pulse duration, said second diode being adapted to return to its high-voltage state in response to the termination of said trigger pulse, and means for deriving an output signal of said opposite polarity across said second diode.

16. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, an inductance connected between said first and second terminals, means for applying a bias voltage to said first terminal, said bias voltage having a predetermined polarity and being adapted to operate said first and second diodes monostably in the low- and high-voltage states respectively, means for applying trigger pulses of said predetermined polarity to said second terminal, each of said trigger pulses being adapted to reverse the states of both of said diodes for the pulse duration, said diodes being adapted to return their respective original states in response to the termination of said trigger pulse, and means for deriving an output signal across said second diode of a polarity opposite to said predetermined polarity.

17. An electrical circuit comprising first and second resistive impedances connected in a first series combination between a first terminal and a reference point, first and second identical tunnel diodes connected with the same polarity in a second series combination, the anode of said first diode being connected to a second terminal and the cathode of said second diode being connected to said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, an inductance connected between said first and second terminals, means for applying a bias voltage to said first terminal, said bias voltage having a predetermined polarity and being adapted to bias said first and second diodes for monostable operation in said low- and high-voltage states respectively, means for applying trigger pulses of said predetermined polarity to said second terminal, each of said trigger pulses being adapted to reverse the respective voltage states of said diodes for the pulse duration, said diodes being adapted to return to their respective original states in response to the termination of said pulse, and means for deriving an output signal at the connecting point of said second series combination having a polarity opposite to said predetermined polarity.

18. An electrical circuit comprising an inductive impedance having first and second terminals, a common junction point, a first resistive impedance and a first tunnel diode connected between said junction point and said first and second terminals respectively, a second resistive impedance and a second tunnel diode connected between said junction point and a reference point, said first and second tunnel diodes being poled to conduct current to said junction point and to said reference point respectively, said first and second tunnel diodes each having a characteristic including a negative resistance region intermediate a pair of instability points, means for applying a bias voltage between said first terminal and said reference point, and means for including a relatively low internal resistance for applying trigger pulses to said second terminal.

19. An electrical circuit for carrying out logical operations comprising, first and second resistive impedances connected in a first series combination, first and second like-poled tunnel diodes connected in a second series combination having corresponding pairs of peak and valley threshold current levels, said current level pairs being different for each of said diodes, each of said tunnel diodes having a characteristic including a negative resistance region intermediate a pair of instability points, the connecting points of said first and second series combinations being coupled together, an inductive impedance connected between the free terminals of said first resistive impedance and of said first tunnel diode respectively, the free terminals of said second resistive impedance and of said second diode respectively being coupled to a common reference point, means for applying a bias voltage across said first series combination, means for applying trigger pulses to said free terminal of said first tunnel diode, and means for deriving an output signal from the connecting point of said second series combination.

20. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, an inductance connected between said first and second terminals, means for biasing said diodes to provide monostable operation of said first and second diodes in said low- and high-voltage states respectively, means including said inductance for applying trigger pulses to said circuit, each of said trigger pulses being adapted to reverse the voltage state of at least one of said diodes for the pulse duration, said one diode being adapted to return to its original state upon the termination of said trigger pulse, and means for deriving an output signal from the connecting point of said second series combination.

21. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, first and second magnetic cores each having a substantially rectangular hysteresis characteristic and further including sense and drive windings, the sense winding of said first core being connected between said first and second terminals, means for applying a bias voltage to said first terminal to provide monostable operation of said first and second diodes in said low- and high-voltage states respectively, said sense winding being adapted to apply a voltage input pulse to said circuit in response to the switching of said first core, each of said input pulses being adapted to reverse the state of at least one of said diodes for the pulse duration, said diode being adapted to switch back to its original state in response to the termination of said input pulse, and means for coupling the connecting point of said second series combination to the drive winding of said second core.

22. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states of diode operation respectively, first and second magnetic cores each having a substantially rectangular hysteresis characteristic to provide set and reset core states, said cores further including sense and drive windings, the sense winding of said first core being connected between said first and second terminals, means for biasing said diodes for monostable operation, said sense winding being connected to apply a voltage input pulse of a predetermined polarity to said circuit whenever said first core is switched to its reset state, each of said input pulses being adapted to reverse the state of at least one of said diodes for the pulse duration, said diode being adapted to switch back to its original state in response to the termination of said input pulse, and means for coupling the drive winding of said second core across said second diode to derive an output pulse of said predetermined polarity.

23. An electrical circuit comprising first and second resistive impedances connected in a first series combination between a first terminal and a reference point, first and second tunnel diodes connected with the same polarity in a second series combination, the anode of said first diode being connected to a second terminal and the cathode of said second diode being connected to said reference point, the connecting points of respective series combinations being coupled together, each of said diodes having a characteristic including a negative resistance range located between first and second positive resistance regions and separated therefrom by a pair of instability points, said pairs of instability points having corresponding pairs of current levels which differ for respective ones of said diodes, said individual diode characteristics forming a composite characteristic having a plurality of said positive resistance regions, said positive resistance regions being adapted to sustain stable low- and high-voltage states of diode operation respectively, an inductance connected between said first and second terminals, means for biasing said first and second diodes for monostable operation in said low- and high-voltage states respectively, means for applying trigger pulses adapted to swtich the voltage state of at least one of said diodes for the pulse duration, said diode being adapted to return to its original state in response to the pulse termination, and means for deriving an output signal at the connecting point of said second series combination.

24. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative resistance range located between first and second positive resistance regions, said positive resistance regions being adapted to sustain stable low- and high-voltage states respectively, first and second magnetic cores each having a substantially rectangular hysteresis characteristic to provide set and reset core states, said cores further including sense and drive windings, the sense winding of said first core being connected between said first and second terminals, means for applying a bias voltage to said first terminal adapted to provide monostable operation of said first and second diodes in said low- and high-voltage states respectively, said sense winding being adapted to apply a voltage input pulse to said circuit whenever said first core is switched to its reset state, each of said input pulses being adapted to reverse the respective voltage states of said diodes for the pulse duration, said diodes being adapted to return to their original states in response to the termination of said input pulse, and means for coupling the drive winding of said second core across said second diode to derive an output pulse.

25. An electrical circuit comprising first and second resistive impedances connected in a first series combination between a first terminal and a reference point, first and second like-poled tunnel diodes connected in a second series combination between a second terminal and said reference point, the connecting points of respective series combinations being coupled together, each of said diodes having a characteristic including a negative impedance range located between first and second positive resistance regions, said positive resistance regions being adapted to sustain low- and high-voltage stable states of diode operation respestively, first and second magnetic cores each having a substantially rectangular hysteresis characteristic to provide set and reset core states, said cores further including sense and drive windings, the sense winding of said first core being connected between said first and second terminals, means for applying a bias voltage to said first terminal, said bias voltage having a predetermined polarity and being adapted to provide monostable operation of said first and second diodes in said low- and high-voltage states respectively, said sense winding being adapted to apply a voltage input pulse of said predetermined polarity to said circuit whenever said first core is switched to its reset state, each of said input pulses being adapted to switch said second diode to its low-voltage state for the pulse duration, said diode being adapted to switch back to its original state in response to the termination of said input pulse, and means for coupling the drive winding of said second core across said second diode to derive an output signal of a polarity opposite to said predetermined polarity.

References Cited in the file of this patent

Tunnel Diode-Circuits and Applications by I. A. Lesk, N. Holonyork, Jr., and U. S. Davidsohn, Electronics, November 27, 1959 (page 64, FIG. 14, relied upon).